United States Patent
Xu et al.

(10) Patent No.: US 11,917,893 B2
(45) Date of Patent: Feb. 27, 2024

(54) MASK PLATE, METHOD FOR MANUFACTURING MASK PLATE, AND ORGANIC LIGHT-EMITTING DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Peng Xu, Beijing (CN); Jiangtao Deng, Beijing (CN); Fengli Ji, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 838 days.

(21) Appl. No.: 16/970,785

(22) PCT Filed: Oct. 22, 2019

(86) PCT No.: PCT/CN2019/112545
§ 371 (c)(1),
(2) Date: Aug. 18, 2020

(87) PCT Pub. No.: WO2021/077294
PCT Pub. Date: Apr. 29, 2021

(65) Prior Publication Data
US 2022/0384768 A1 Dec. 1, 2022

(51) Int. Cl.
*H10K 71/00* (2023.01)
*C23C 14/04* (2006.01)
*G03F 7/00* (2006.01)

(52) U.S. Cl.
CPC ........... *H10K 71/00* (2023.02); *C23C 14/042* (2013.01); *G03F 7/0015* (2013.01)

(58) Field of Classification Search
CPC .... H10K 71/00; H10K 71/166; C23C 14/042; G03F 7/0015; G03F 1/38
See application file for complete search history.

(56) References Cited

U.S. PATENT DOCUMENTS

| 6,033,811 A | 3/2000 | Lee |
| 2007/0278933 A1 | 12/2007 | Chao et al. |

(Continued)

FOREIGN PATENT DOCUMENTS

| CN | 102955353 A | 3/2013 |
| CN | 103713466 A | 4/2014 |

(Continued)

OTHER PUBLICATIONS

International Search Report of PCT/CN2019/112545 in Chinese, dated Jul. 29, 2020.

(Continued)

*Primary Examiner* — Douglas W Owens
(74) *Attorney, Agent, or Firm* — Collard & Roe, P.C.

(57) ABSTRACT

A mask plate, a method for manufacturing a mask plate, and a method for manufacturing an organic light-emitting device are disclosed. The mask plate includes a substrate and a first opening portion and a second opening portion formed on the substrate. The first opening portion includes a first edge and a second edge, an extending line of the first edge and an extending line of the second edge intersect at a first vertex to form a first corner, the second opening portion is at the first corner and protrudes outward, and an edge of the second opening portion intersects with the first edge and the second edge. The first opening portion and the second opening portion are used for evaporation on a display area of an organic light-emitting device, and the second opening portion is used to compensate for a corner of the display area during evaporation.

20 Claims, 5 Drawing Sheets

(56) References Cited

U.S. PATENT DOCUMENTS

| | | | |
|---|---|---|---|
| 2016/0026089 A1 | 1/2016 | Chen | |
| 2019/0251895 A1 | 8/2019 | Zhang et al. | |
| 2021/0328201 A1* | 10/2021 | Zhou | G03F 1/76 |
| 2022/0384726 A1* | 12/2022 | Ji | C23C 14/042 |

FOREIGN PATENT DOCUMENTS

| | | | | | |
|---|---|---|---|---|---|
| CN | 105803390 | A | * | 7/2016 | C23C 14/044 |
| CN | 106567052 | A | * | 4/2017 | C23C 16/042 |
| CN | 108520882 | A | | 9/2018 | |
| CN | 207966993 | U | | 10/2018 | |
| CN | 208970513 | U | | 6/2019 | |

OTHER PUBLICATIONS

Notice of Transmittal of the International Search Report of PCT/CN2019/112545 in Chinese, dated Jul. 29, 2020.
Written Opinion of the International Searching Authority of PCT/CN2019/112545 in Chinese, dated Jul. 29, 2020.

* cited by examiner

MASK PLATE, METHOD FOR MANUFACTURING MASK PLATE, AND ORGANIC LIGHT-EMITTING DEVICE

CROSS REFERENCE TO RELATED APPLICATIONS

This application is the National Stage of PCT/CN2019/112545 filed on Oct. 22, 2019, the disclosure of which is incorporated by reference.

TECHNICAL FIELD

Embodiments of the present disclosure relate to a mask plate, a method for manufacturing a mask plate, and an organic light-emitting device (OLED).

BACKGROUND

Organic light-emitting display devices have the advantages of self-luminescence, fast response, wide viewing angle, high brightness, bright colors, lightness and thinness, etc., and therefore become an important display technology. The organic light-emitting display device can be prepared by using ink jet printing, vapor evaporation and other methods. The vapor evaporation method has the advantages of simple operation, easy control of film thickness, easy realization of doping, etc. A mask plate is required in the process of preparing an organic light-emitting display device by using thin film evaporation, in order to evaporate a specific material at a specific location such as a pixel area. The mask plate usually includes a mask pattern, and the mask pattern is used as a mask during vapor evaporation, so as to form a corresponding thin film pattern on the substrate to be evaporated.

SUMMARY

At least one embodiment of the present disclosure provides a method for manufacturing a mask plate, and the method comprises: providing a substrate; and forming a first opening portion and a second opening portion on the substrate by using an etching method. The first opening portion comprises a first edge and a second edge that extend linearly, an extending line of the first edge and an extending line of the second edge intersect at a first vertex to form a first corner of the first opening portion, the second opening portion is at the first corner and protrudes outward, and an edge of the second opening portion intersects with the first edge and the second edge, thereby communicating with the first opening portion, the first opening portion and the second opening portion are used for evaporation on a display area of an organic light-emitting device, and the second opening portion is used to compensate for a corner of the display area during evaporation.

In some examples, the etching method is wet etching, and the second opening portion is further configured to perform etching compensation for the first corner.

In some examples, a maximum vertical distance between the edge of the second opening portion and the extending line of the first edge ranges approximately from 40 to 60 microns.

In some examples, a maximum vertical distance between the edge of the second opening portion and the extending line of the second edge ranges approximately from 40 to 60 microns.

In some examples, the extending line of the first edge and the extending line of the second edge intersect substantially perpendicularly.

In some examples, the edge of the second opening portion intersects with the first edge at a first intersection point and intersects with the second edge at a second intersection point, and a distance between the first intersection point and the first vertex is approximately equal to a distance between the second intersection point and the first vertex.

In some examples, the etching method comprises exposure by using a photolithography mask plate, and the photolithography mask plate comprises a first pattern for forming the first opening portion and a second pattern for forming the second opening portion.

In some examples, a shape of the second pattern is a portion of a circle, a regular polygon, or an irregular polygon.

In some examples, a center of the circle is the first vertex.

At least one embodiment of the present disclosure further provides a mask plate, which comprises: a substrate and a first opening portion and a second opening portion formed on the substrate. The first opening portion comprises a first edge and a second edge that extend linearly, an extending line of the first edge and an extending line of the second edge intersect at a first vertex to form a first corner of the first opening portion, the second opening portion is at the first corner and protrudes outward, and an edge of the second opening portion intersects with the first edge and the second edge, thereby communicating with the first opening portion, the first opening portion and the second opening portion are used for evaporation on a display area of an organic light-emitting device, and the second opening portion is used to compensate for a corner of the display area during evaporation.

In some examples, a maximum vertical distance between the edge of the second opening portion and the first edge ranges approximately from 40 to 60 microns, and a maximum vertical distance between the edge of the second opening portion and the second edge ranges approximately from 40 to 60 microns.

In some examples, the extending line of the first edge and the extending line of the second edge intersect substantially perpendicularly.

In some examples, the edge of the second opening portion intersects with the first edge at a first intersection point and intersects with the second edge at a second intersection point, and a distance between the first intersection point and the first vertex is approximately equal to a distance between the second intersection point and the first vertex.

At least one embodiment of the present disclosure further provides an organic light-emitting device, which comprises: a display area and a peripheral area. The display area comprises a function layer, the function layer has a shape corresponding to the first opening portion and the second opening portion of the mask plate described above, and the function layer has a boundary of a corner of the second opening portion.

In some examples, the function layer comprises at least one of a hole injection layer, a hole transport layer, an electron injection layer, an electron transport layer, a capping layer, or a common electrode layer.

BRIEF DESCRIPTION OF THE DRAWINGS

In order to more clearly illustrate the technical solution of the embodiments of the present disclosure, the drawings of the embodiments are briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application, are not intended to indicate any sequence, amount or importance, but distinguish various components. Similarly, similar words such as "a", "one" or "the" do not mean limitation to quantity, but mean that there is at least one. The terms "comprise," "comprising," "include," "including," etc., are intended to specify that the elements or the objects stated before these terms encompass the elements or the objects and equivalents thereof listed after these terms, but do not preclude the other elements or objects. The terms "connect", "connecting" and the like are not limited to physical or mechanical connections, but may include electrical connections, regardless of whether the connections are direct or indirect connections. "On," "under," "right," "left" and the like are only used to indicate relative position relationship, and when the position of the object which is described is changed, the relative position relationship may be changed accordingly.

The evaporation method is one of the commonly used methods for thin film deposition. In the thin film evaporation process, in order to form a thin film layer with a certain pattern, a mask plate needs to be used. Because the organic light-emitting diode display panel has a series of advantages such as self-luminous, low power consumption, high display brightness, wide viewing angle, fast response speed and so on, the organic light-emitting diode display panel is increasingly popular in the market. The organic light-emitting layer and the function layer in the organic light-emitting diode display panel, for example, can usually be formed by an evaporation method.

Due to the influence of the alignment accuracy of the mask plate and the evaporation shadow (EV shadow), the mask plate needs to be designed with a certain margin, and the design of the margin satisfies the following relationship: margin=alignment accuracy+evaporation shadow.

In the case where the shape of the display area of the display panel to be manufactured is, for example, a rectangle, the shape of the opening portion of the corresponding mask plate is also a rectangle. The mask plate can be made by a photolithography process using a metal plate, for example, by wet etching. However, wet etching may form rounded corners at the corners of the rectangular area due to the isotropic properties, so that the margin at the corners is significantly reduced compared to the straight-line segments of the rectangular area. Generally, in the case where the thickness of the mask plate is 100 microns, the radius R of the rounded corner caused by etching is about 150 microns; in the case where the thickness of the mask plate is 150 microns, the radius R of the rounded corner caused by etching is about 200 microns; and in the case where the thickness of the mask plate is 200 microns, the radius R of the rounded corner caused by etching is about 250 microns.

Figure 1:
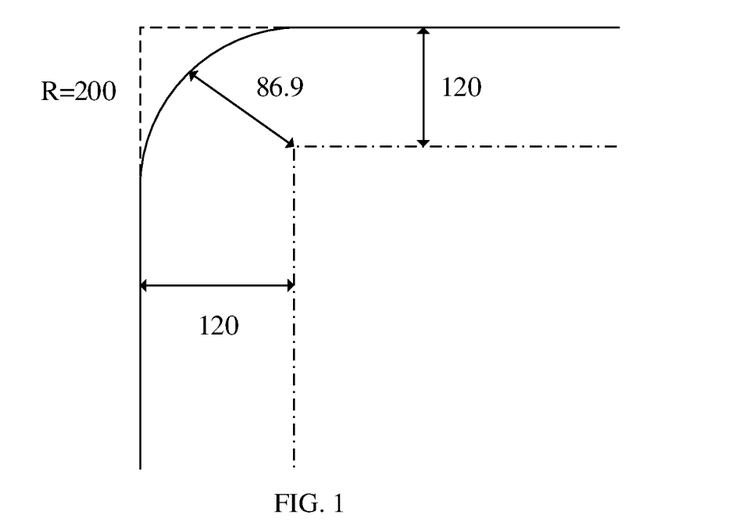
FIG. 1 is a schematic diagram illustrating the rounded corner problem caused by the photolithography process.
Figure 2A:
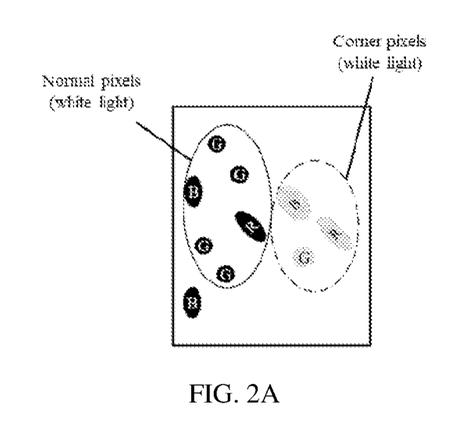
FIGS. 2A-2D are schematic diagrams of actual luminescence process of respective pixels (white, red, green, blue) in the case where the margin of the corner is insufficient, respectively.
Figure 2B:
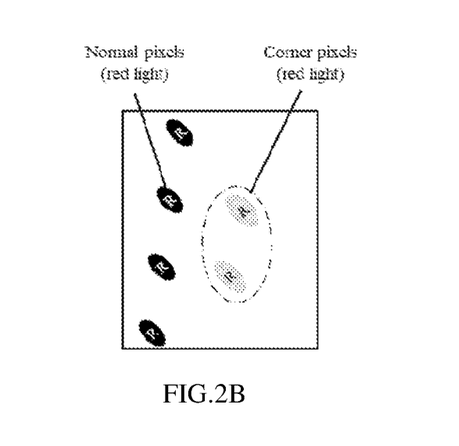
Figures 2C, 2D:
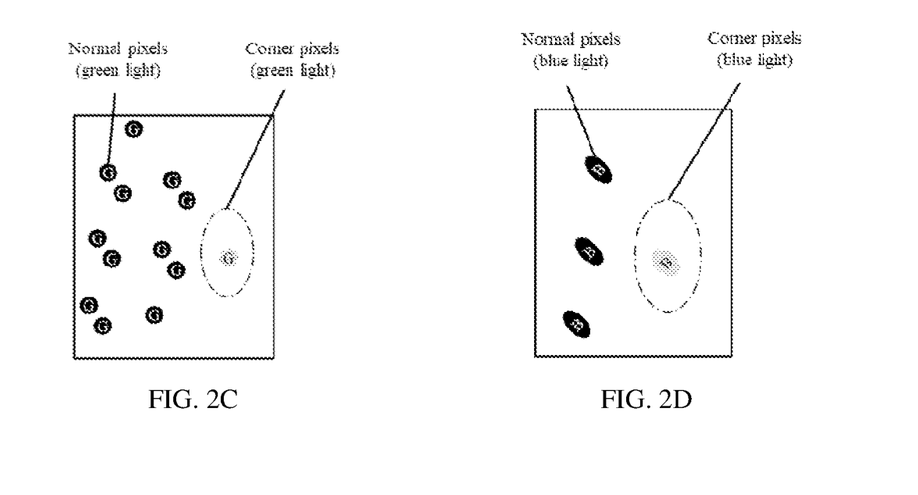

The effect of the etched rounded corners on the margin is illustrated in FIG. 1. In the case where the margin of the straight-line area is 120 microns and the radius R of the etched rounded corner is 200 microns, the available margin of the corner is 86.9 microns. In the case that the mask plate alignment accuracy and evaporation shadow are the same, according to the above formula, assuming that the sum of the mask plate alignment accuracy and evaporation shadow is equal to the straight line margin (i.e., 120 microns), the margin of the corner is only 86.9 microns, which is significantly smaller than the straight line margin. Under the same process conditions, the corner pixels have insufficient margins, which causes that the thickness of the function layer (such as the common cathode layer, etc.) formed by evaporation cannot be ensured, so that the corner pixels appear darker display phenomenon compared to the pixels in the non-edge part of the display area when displaying the same gray scale data signal.

FIGS. 2A-2D are schematic diagrams of actual luminescence process of respective pixels (white, red, green, blue) in the case where the margin of the corner is insufficient, respectively. The dotted line indicates the corner pixels, which are also called dark pixels, and the remaining light-emitting pixels are pixels formed under normal margin. In FIGS. 2A-2D, the letters illustrated in the pixels represent different pixel colors. For example, R represents red light pixels, B represents blue light pixels, G represents green light pixels, and white light pixels are composed of three types of pixels of RGB. In addition, the solid-color icons indicate normal pixels, and the shaded icons indicate dark pixels. In the light-emitting graphs of the four colors of light-emitting pixels, the light-emitting intensity of the corner pixels (dark pixels) formed due to insufficient margins is less than the light-emitting intensity of normal pixels, for example, less than about 30%-50% of the light-emitting intensity of normal pixels. Therefore, it is necessary to increase the margin of the corner pixel so as to form a uniform light-emitting area.

At least one embodiment of the present disclosure provides a method for manufacturing a mask plate and the mask plate obtained thereby. The method includes: providing a substrate; and forming a first opening portion and a second opening portion on the substrate by using an etching method. The first opening portion includes a first edge and a second edge that extend linearly, an extending line of the first edge and an extending line of the second edge intersect at a first vertex to form a first corner of the first opening portion, the second opening portion is located at the first corner and protrudes outward, and an edge of the second opening portion intersect with the first edge and the second edge, thereby communicating with the first opening portion. The first opening portion and the second opening portion are used for evaporation on a display area of an organic light-emitting device, and the second opening portion is used to compensate for a corner of the display area during evaporation.

In the case where the mask plate obtained by the manufacturing method of the foregoing embodiments is used to manufacture an organic light-emitting device, the margin of the corner pixel can be increased to improve the evaporation uniformity of the display area, thereby improving the display quality of the display area.

Some other embodiments of the present disclosure also provide a photolithography mask plate for performing the above manufacturing method and forming the above mask plate. The photolithography mask plate includes a first pattern for forming the first opening portion and a second pattern for forming the second opening portion.

The various embodiments of the present disclosure are described below in combination with specific drawings.

Figure 3:
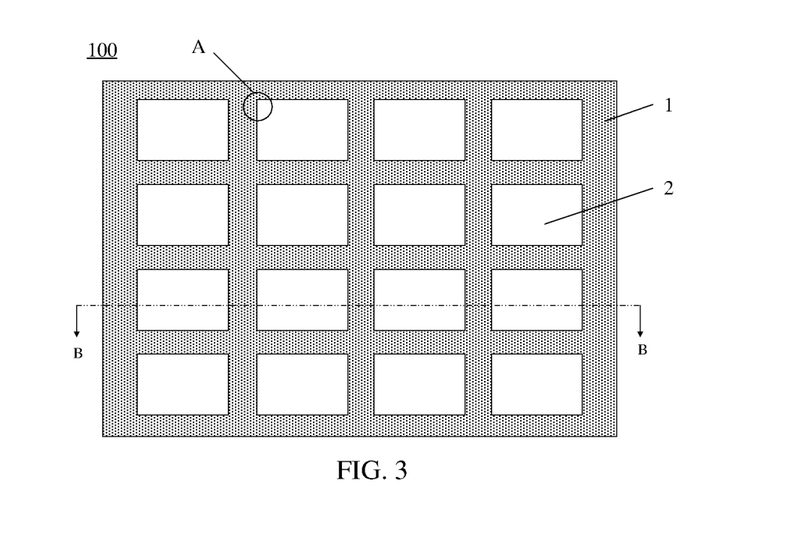
FIG. 3 illustrates a front view of a mask plate according to at least one embodiment of the present disclosure.
Figure 4:
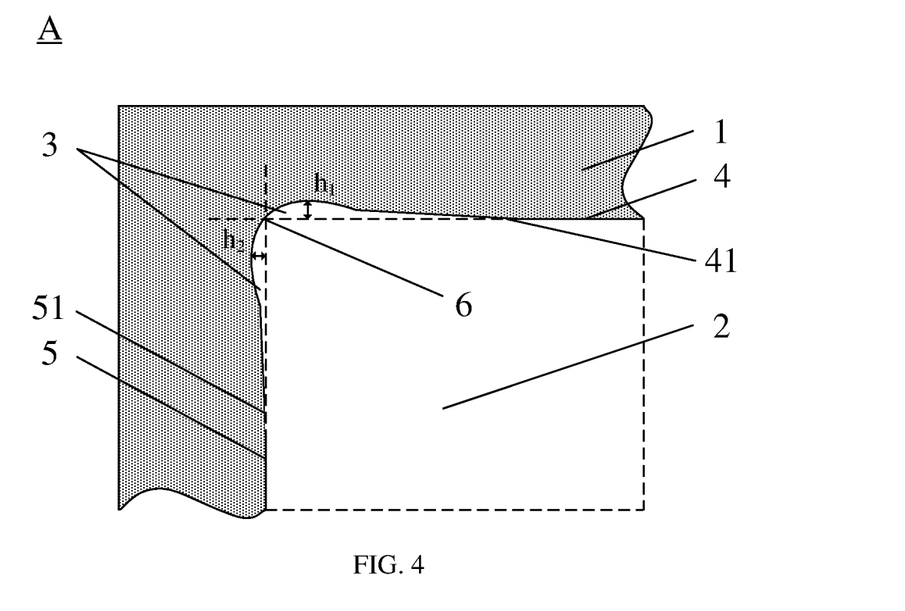
FIG. 4 illustrates a partial enlarged view of the mask plate illustrated in FIG. 3.

At least one embodiment of the present disclosure provides a mask plate 100, as illustrated in FIG. 3 and FIG. 4. The mask 100 includes a substrate 1 and a first opening portion 2 and a second opening portion 3 formed on the substrate 1.

For example, the mask plate 100 may include a plurality of first opening portions 2 and a plurality of second opening portions 3, which correspond to each first opening portion 2, respectively. For example, each of the first opening portions 2 corresponds to a display area of a display panel to be manufactured, so that the mask plate 100 can be used for simultaneously manufacturing a plurality of display panels, which are, for example, display panels for the portable electronic device (e.g., a mobile phone, a smart watch, etc.). The shape of the first opening portion 2 is rectangular in this embodiment. The first opening portion 2 can also be designed in other regular or irregular shapes according to actual needs, such as an irregular shape with a protrusion in the middle of the top end.

In use, the mask plate 100 can be further combined with a frame to obtain an evaporation assembly. For example, the mask plate 100 can be welded to the frame at an edge portion (for example, a welding portion of the edge portion), and the frame provides support for the mask plate 100.

In order to more clearly illustrate the shape of the corner of the first opening portion 2 and the second opening portion 3, FIG. 4 is a partially enlarged view of portion A in FIG. 3. The first opening portion 2 comprises a first edge 4 and a second edge 5 that extend linearly, and an extending line of the first edge 4 and an extending line of the second edge 5 intersect perpendicularly at a first vertex 6 to form a first corner of the first opening portion 2. It should be noted that the first vertex 6 may be located on an actual edge, or may also be located within the second opening portion, which is a virtual corner in this case. In this embodiment, the angle of the first corner is 90 degrees. The first corner can also be designed as other angles according to the shape of the first opening portion 2, such as an acute angle or an obtuse angle, and the angle of the first corner depends on the shape of the first opening portion 2.

Similarly, the first opening portion 2 may also include a second corner, a third corner, and a fourth corner that are the same as the first corner at other vertexes. For the sake of concise description, the description is mainly for the first corner, and the structure of other corners can be derived by analogy.

As illustrated in FIG. 4, the second opening portion 3 is located at the corner and protrudes outward, and an edge of the second opening portion 3 intersect with the first edge 4 and the second edge 5, respectively, thereby communicating with the first opening portion 2. The first opening portion 2 and the second opening portion 3 are used for evaporation on the display area of the organic light-emitting device, and the second opening portion 3 is used to compensate for the corner of the display area during evaporation.

For example, the edge of the second opening portion 3 intersects with the first edge 4 at a first intersection point 41, and intersects with the second edge 5 at a second intersection point 51. Therefore, the second opening portion 3 communicates with the first opening portion 2. In this example, the distance between the first intersection point 41 and the first vertex 6 is approximately equal to the distance between the second intersection point 51 and the first vertex 6, that is, the two portions of the second opening portion 3 are approximately symmetrical about the bisector of the first vertex 6. And considering the error of the actual processing, the present disclosure is not limited thereto. The distance between the first intersection point 41 and the first vertex 6 may not be equal to the distance between the second intersection point 51 and the first vertex 6.

For example, the extending line of the first edge 4 and the extending line of the second edge 5 intersect substantially perpendicularly, as illustrated in FIG. 4.

In this embodiment, the second opening portion 3 extends outward relative to the first opening portion 2 in directions perpendicular to the first edge 4 and the second edge 5, respectively. In this embodiment, the edge of the second opening portion 3 is a combination of an arc part and a straight-line part, and the arc part passes through the first vertex 6. Considering the error of the actual processing, the present disclosure is not limited thereto. The arc part may not pass through the first vertex 6, it is only necessary to ensure that the radial distance between the first vertex 6 and the arc part is within 5 microns.

As illustrated in FIG. 4, the maximum vertical distance between the edge of the second opening portion 3 and the first edge 4 is h1, and the maximum vertical distance between the edge of the second opening portion 3 and the second edge 5 is h2. The range of h1 and h2 is from 40 microns to 60 microns. This configuration is mainly taken into account for compensation for the rounded corners of the mask plate 100 to be etched, and there is a need for an over-etching during the production of the mask plate 100 so as to compensate for the rounded corners and increase the margin at the same time. But the scope of over-etching should not be too large, otherwise the second opening portion 3 with a larger area may be produced, which may affect the area and thickness of the function layer subsequently evaporated. Therefore, the edge of the second opening portion 3 needs to be kept within a reasonable range, so that the over-etched part only affects the area and thickness of the function layer in a small range, thereby preventing significant effect on the display panel. In an example, the exemplary dimensions of the produced mask plate 100 are: h1=51 μm, and h2=42 μm.

Hereinafter, various exemplary shapes of the photolithography mask plate used for manufacturing the mask plate 100 by using the etching method are described in combination with FIGS. 5-8.

In order to simplify the description, the design of a second pattern 8 of the photolithography mask plate for forming the second opening portion is introduced below. The shape of a first pattern 7 of the photolithography mask plate is the same as the shape and size of the first opening portion 2 of the mask plate 100, and only a part of the first pattern 7 is illustrated here.

Figure 5:
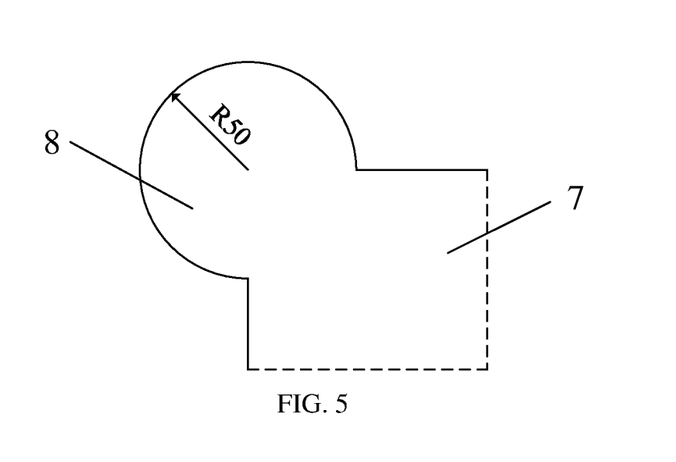
FIG. 5 illustrates a partial enlarged view of a photolithography mask plate according to at least one embodiment of the present disclosure.

The shape of the second pattern 8 may be a portion of a circle, a regular polygon, or an irregular polygon. For example, as illustrated in FIG. 5, the shape of the second pattern 8 is a ¾ circle, the radius R is 50 microns, and the first vertex 6 is the center of the circle. The present disclosure is not limited thereto. The second pattern 8 can also be fan-shaped, or the radius of the second pattern 8 may range from 40 to 60 microns, and corresponding adjustments and modifications can be made according to actual process requirements, for example, a fluctuation about 10%-20% to the above range.

Figure 6:
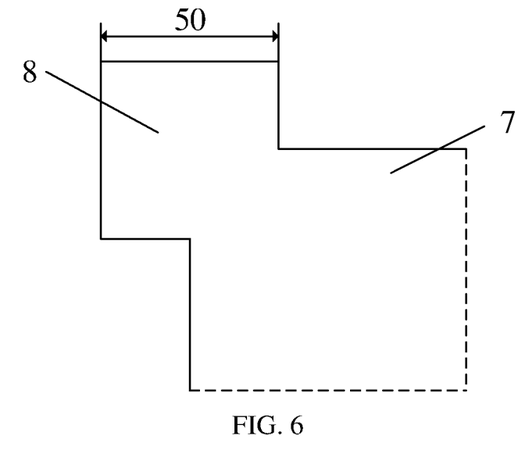
FIG. 6 illustrates a partial enlarged view of a photolithography mask plate according to another embodiment of the present disclosure.

For example, as illustrated in FIG. 6, the shape of the second pattern 8 is a ¾ square, the side length of the square is 50 microns, and the center of the square is the first vertex 6. The present disclosure is not limited thereto. The side length of the second pattern 8 may range from 40 to 60 microns, and corresponding adjustments and modifications can be made according to actual process requirements.

Figure 7:
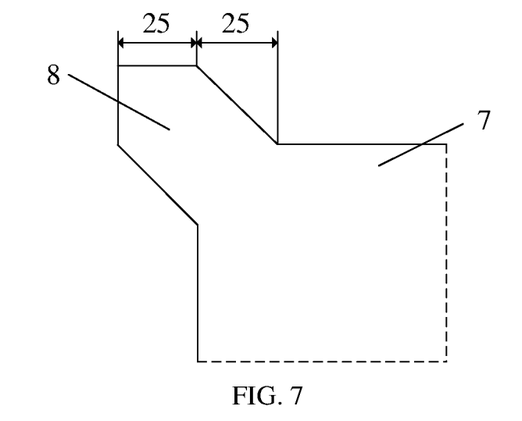
FIG. 7 illustrates a partial enlarged view of a photolithography mask plate according to further embodiment of the present disclosure.
Figure 8:
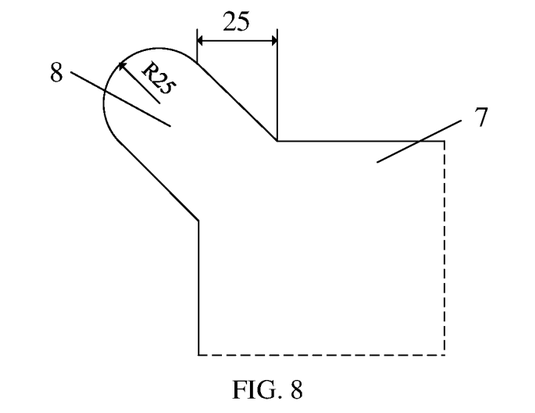
FIG. 8 illustrates a partial enlarged view of a photolithography mask plate according to still another embodiment of the present disclosure.

For example, as illustrated in FIG. 7, the shape of the second pattern 8 is an irregular polygon, which includes two adjacent edges parallel to the first edge 4 and the second edge 5, respectively, and further includes two opposite edges intersecting with the first edge 4 and the second edge 5, respectively. The two opposite edges are parallel to each other and extend at an angle of 45 degrees with the first edge 4 and the second edge 5, respectively. The length of the adjacent two edges is 25 microns, and the horizontal (or vertical) distance between the two opposite edges is 25 microns. The present disclosure is not limited thereto, and the shape of the second pattern 8 may be made with adjustments and modifications in accordance with the actual needs of the process. For example, combination can be made based on the examples illustrated in FIGS. 5-7. In one possible variation, for example, in FIG. 8, the second pattern 8 is shaped as a combination of the two opposite edges in FIG. 7 and a semicircle with a radius of 25 microns.

The above illustrates several examples of the shape of the photolithography mask plate used to manufacture the mask plate 100 by using the etching method. The above shapes are intended to form the second opening portion 3 so as to compensate for the rounded corners generated during etching the corner. Therefore, based on the inventive concept of the embodiments of the present disclosure, those skilled in the art can easily think of other shapes of the second pattern 8 extending outward and located at the corners of the rectangle.

Hereinafter, a method for manufacturing the mask plate 100 according to at least one embodiment of the present disclosure is described with reference to FIGS. 9-12.

Figure 9:
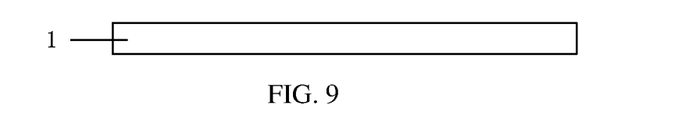
FIG. 9 to FIG. 12 illustrate a method for manufacturing a mask plate in section taken according to the line B-B in FIG. 3.

First, as illustrated in FIG. 9, a substrate 1 is provided. Examples of the material of the substrate 1 include invar alloy, nickel-iron alloy or other suitable materials. The thickness of the substrate 1 may range from 80 microns to 200 microns, and the embodiments of the present disclosure are not limited thereto.

Figure 10:
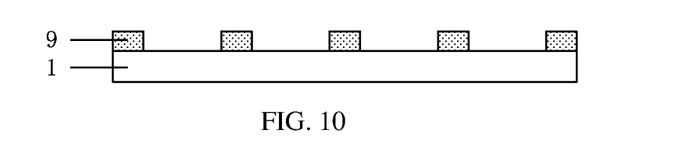

As illustrated in FIG. 10, for example, a photoresist layer can be deposited on the substrate 1. The above-mentioned photolithography mask plate is used, and the photolithography process including an exposure process and a development process is performed to pattern the photoresist layer, so as to form a photoresist pattern 9 on the substrate 1. The photoresist pattern 9 exposes the first pattern 7 and the second pattern 8 to be formed on the substrate 1.

Figure 11:
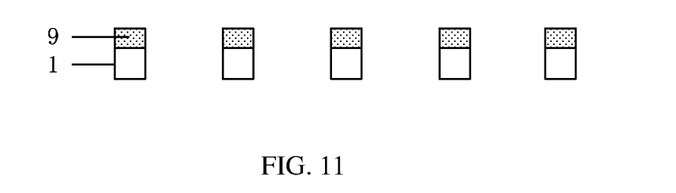

As illustrated in FIG. 11, the first pattern 7 and the second pattern 8 of the substrate 1 are etched by using the above-mentioned photoresist pattern 9 as an etching mask. By controlling factors such as etching time, etching rate, etc., an opening portion is formed on the substrate 1, and the opening portion includes the first opening portion 2 and the second opening portion 3 described above. There may be a plurality of opening portions, for example, may be four opening portions. The first opening portion 2 and the second opening portion 3 are used for evaporation on the display area of the organic light-emitting device, and the second opening portion 3 is used to compensate for the corner of the display area during evaporation.

For example, the etching process is wet etching, and the second opening portion 3 can also be configured to perform etching compensation for the first corner of the first opening portion 2.

Figure 12:
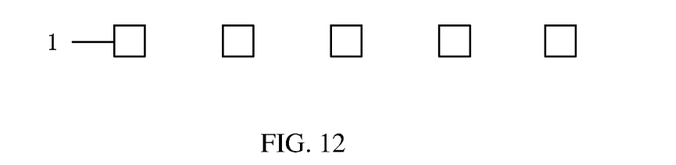

Finally, the photoresist pattern 9 is removed by a peel-off process, thereby forming the mask plate 100 illustrated in FIG. 12.

Hereinafter, an organic light-emitting device 200 and a method for manufacturing the organic light-emitting device 200 according to at least one embodiment of the present disclosure are introduced with reference to FIG. 13.

The organic light-emitting device 200 includes a display area and a peripheral area. The display area includes a function layer. The function layer has a shape corresponding to the first opening portion 2 and the second opening portion 3 of the aforementioned mask plate 100, and has a boundary of a corner of the second opening portion 3.

For example, the organic light-emitting device 200 is an organic light-emitting diode display device. The display device includes an active area, the active area includes a plurality of sub-pixels arranged in an array, and each sub-pixel includes an organic light-emitting diode and a driving circuit. The organic light-emitting diode has a cathode, a light-emitting layer, an anode, etc., and may further include a hole injection layer, a hole transport layer, an electron injection layer, an electron transport layer, a capping layer, etc., as required.

For example, in an embodiment of the present disclosure, the mask plate 100 may be used to form a certain function layer of the organic light-emitting device. The function layer is at least one of a hole injection layer, a hole transport layer, an electron injection layer, an electron transport layer, a capping layer, or a common electrode layer, such as the common electrode layer (common cathode layer). In this embodiment, the method for manufacturing the organic light-emitting device 200 by using, for example, the mask plate 100 is introduced.

Figure 13:
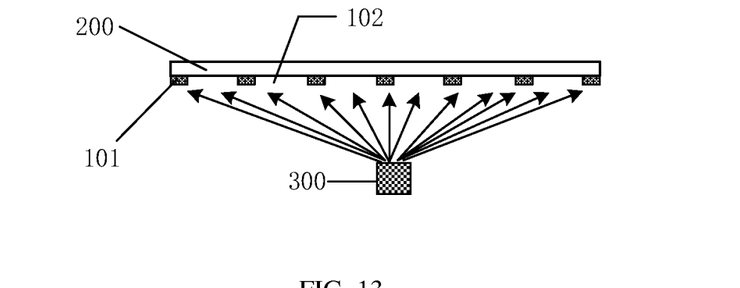
FIG. 13 is a schematic diagram of a method for manufacturing an organic light-emitting device according to at least one embodiment of the present disclosure.

As illustrated in FIG. 13, the mask plate 100 is provided on the evaporation surface of the organic light-emitting device 200 to be evaporated. The mask plate 100 includes a shielding portion 101 and an opening portion 102. The opening portion 102 is in an opening structure, and for example, the shape of the opening portion 102 can be defined by the first opening portion 2 and the second opening portion 3 of the mask plate 100. For specific implementation manners, reference may be made to the content described in the foregoing embodiments, and is not repeated herein in the present embodiment. An evaporation source 300 is disposed on a side facing the evaporation surface of the organic light-emitting device 200.

For example, as illustrated in FIG. 13, when the evaporation source 300 evaporates a material on the evaporation surface of the organic light-emitting device 200, the evaporated material is evaporated to the region of the organic light-emitting device 200 corresponding to the opening portion 102 through the mask opening area of the mask plate 100, while the area of the organic light-emitting device 200 that is shielded by the shielding portion 101 of the mask plate 100 may not be formed with the evaporated material. In this embodiment, by designing the second opening portion 3 on the mask plate 100, the original corner margin is improved, and a uniform evaporation thickness can be formed, thereby forming a uniform pixel light-emitting area.

For other technical effects of the method provided in this embodiment, reference may be made to the technical effects of the mask plate described in the foregoing embodiments, which is not repeated herein.

The above are only specific implementations of the present disclosure, but the protection scope of the present disclosure is not limited thereto, and the protection scope of the present disclosure is subject to the protection scope of the appended claims.

What is claimed is:

1. A method for manufacturing a mask plate, comprising:
providing a substrate; and
forming a first opening portion and a second opening portion on the substrate by using an etching method,
wherein the first opening portion comprises a first edge and a second edge that extend linearly, an extending line of the first edge and an extending line of the second edge intersect at a first vertex to form a first corner of the first opening portion,
the second opening portion is at the first corner and protrudes outward, and an edge of the second opening portion intersects with the first edge and the second edge, thereby communicating with the first opening portion,
the first opening portion and the second opening portion are used for evaporation on a display area of an organic light-emitting device, and the second opening portion is used to compensate for a corner of the display area during evaporation,
the edge of the second opening portion is a combination of an arc part and a straight-line part, and the arc part passes through the first vertex.

2. The method according to claim 1, wherein the etching method is wet etching, and the second opening portion is further configured to perform etching compensation for the first corner.

3. The method according to claim 2, wherein a maximum vertical distance between the edge of the second opening portion and the extending line of the first edge ranges approximately from 40 to 60 microns.

4. The method according to claim 2, wherein the extending line of the first edge and the extending line of the second edge intersect substantially perpendicularly.

5. The method according to claim 1, wherein a maximum vertical distance between the edge of the second opening portion and the extending line of the first edge ranges approximately from 40 to 60 microns.

6. The method according to claim 1, wherein a maximum vertical distance between the edge of the second opening portion and the extending line of the second edge ranges approximately from 40 to 60 microns.

7. The method according to claim 1, wherein the extending line of the first edge and the extending line of the second edge intersect substantially perpendicularly.

8. The method according to claim 1, wherein the edge of the second opening portion intersects with the first edge at a first intersection point and intersects with the second edge at a second intersection point, and a distance between the first intersection point and the first vertex is approximately equal to a distance between the second intersection point and the first vertex.

9. The method according to claim 1, wherein the etching method comprises exposure by using a photolithography mask plate, and
the photolithography mask plate comprises a first pattern for forming the first opening portion and a second pattern for forming the second opening portion.

10. The method according to claim 9, wherein a portion of a shape of the second pattern is a portion of a circle, a regular polygon, or an irregular polygon.

11. The method according to claim 10, wherein a center of the circle is the first vertex.

12. A mask plate, comprising:
a substrate; and
a first opening portion and a second opening portion formed on the substrate,
wherein the first opening portion comprises a first edge and a second edge that extend linearly, an extending line of the first edge and an extending line of the second edge intersect at a first vertex to form a first corner of the first opening portion,
the second opening portion is at the first corner and protrudes outward, and an edge of the second opening portion intersects with the first edge and the second edge, thereby communicating with the first opening portion,
the first opening portion and the second opening portion are used for evaporation on a display area of an organic light-emitting device, and the second opening portion is used to compensate for a corner of the display area during evaporation,
the edge of the second opening portion is a combination of an arc part and a straight-line part, and the arc part passes through the first vertex.

13. The mask plate according to claim 12, wherein a maximum vertical distance between the edge of the second opening portion and the first edge ranges approximately from 40 to 60 microns, and
a maximum vertical distance between the edge of the second opening portion and the second edge ranges approximately from 40 to 60 microns.

14. The mask plate according to claim 12, wherein the extending line of the first edge and the extending line of the second edge intersect substantially perpendicularly.

15. The mask plate according to claim 12, wherein the edge of the second opening portion intersects with the first edge at a first intersection point and intersects with the second edge at a second intersection point, and a distance between the first intersection point and the first vertex is approximately equal to a distance between the second intersection point and the first vertex.

16. The mask plate according to claim 13, wherein the extending line of the first edge and the extending line of the second edge intersect substantially perpendicularly.

17. The mask plate according to claim 13, wherein the edge of the second opening portion intersects with the first edge at a first intersection point and intersects with the second edge at a second intersection point, and a distance between the first intersection point and the first vertex is approximately equal to a distance between the second intersection point and the first vertex.

18. The mask plate according to claim 14, wherein the edge of the second opening portion intersects with the first edge at a first intersection point and intersects with the second edge at a second intersection point, and a distance between the first intersection point and the first vertex is approximately equal to a distance between the second intersection point and the first vertex.

19. An organic light-emitting device, comprising: a display area and a peripheral area, wherein the display area comprises a function layer, the function layer has a shape corresponding to a first opening portion and a second opening portion of a mask plate, and the function layer has a boundary of a corner of the second opening portion, wherein the mask plate comprises:

a substrate; and the first opening portion and the second opening portion formed on the substrate, wherein the first opening portion comprises a first edge and a second edge that extend linearly, an extending line of the first edge and an extending line of the second edge intersect at a first vertex to form a first corner of the first opening portion, the second opening portion is at the first corner and protrudes outward, and an edge of the second opening portion intersects with the first edge and the second edge, thereby communicating with the first opening portion, the first opening portion and the second opening portion are used for evaporation on the display area of the organic light-emitting device, and the second opening portion is used to compensate for a corner of the display area during evaporation, the edge of the second opening portion is a combination of an arc part and a straight-line part, and the arc part passes through the first vertex.

20. The organic light-emitting device according to claim 19, wherein the function layer comprises at least one of a hole injection layer, a hole transport layer, an electron injection layer, an electron transport layer, a capping layer, or a common electrode layer.

* * * * *